United States Patent
Yama

[11] Patent Number: 6,121,657
[45] Date of Patent: *Sep. 19, 2000

[54] SEMICONDUCTOR INTEGRATED CIRCUIT DEVICE HAVING GATES ARRANGED IN A LATTICE

[75] Inventor: Michiaki Yama, Kyoto, Japan

[73] Assignee: Rohm Co. Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/895,367

[22] Filed: Jul. 14, 1997

[30] Foreign Application Priority Data

Aug. 23, 1996 [JP] Japan ................................ 8-222850

[51] Int. Cl.⁷ .................................................. H01L 29/76
[52] U.S. Cl. ........................................ 257/341; 257/343
[58] Field of Search .................................. 257/341, 902, 257/343

[56] References Cited

U.S. PATENT DOCUMENTS

| | | | |
|---|---|---|---|
| 4,271,424 | 6/1981 | Inayoshi et al. | 257/44 |
| 4,631,563 | 12/1986 | Iizuka | 257/67 |
| 5,355,008 | 10/1994 | Moyer et al. | 257/341 |
| 5,635,742 | 6/1997 | Hoshi et al. | 257/337 |

FOREIGN PATENT DOCUMENTS 7-221192  8/1995  Japan .

*Primary Examiner*—Mahshid Saadat
*Assistant Examiner*—George C. Eckert, II
*Attorney, Agent, or Firm*—Arent Fox Kintner Plotkin & Kahn LLP

[57] ABSTRACT

In a semiconductor integrated circuit device using a MOS type transistor as a transistor for the output of a great current, the source and drain of the transistor is formed by connecting in parallel a plurality of source regions and drain regions surrounded by a gate electrode.

1 Claim, 2 Drawing Sheets

SEMICONDUCTOR INTEGRATED CIRCUIT DEVICE HAVING GATES ARRANGED IN A LATTICE

BACKGROUND OF THE INVENTION

1. Field of the Invention

The present invention relates to semiconductor integrated circuit devices. More particularly, the present invention relates to a semiconductor integrated circuit device that includes an output circuit formed of a plurality of MOS transistors.

2. Description of the Background Art

Many driving circuits of portable devices with a battery as the power and switching circuits of switching power supply employ a MOS type transistor (referred to as "MOS transistor" hereinafter) as shown in the circuit diagram of FIG. 2 for the output transistor where a great current flows in order to reduce the power consumption of the semiconductor integrated circuit device to increase the operable time period of the device as much as possible. A MOS transistor operates under voltage control, so that it is not necessary to conduct a base current as in a bipolar transistor. This means that the operating time of the device can be increased by a time period corresponding to the power consumed as a base current. In an output transistor that drives a great current, the loss due to the base current is often too great to be neglected.

The output circuit shown in FIG. 2 includes N type MOS transistors T1 and T2 connected in series between a first power supply voltage (VDD1) and a reference potential (GND), and a P type MOS transistor T3 and an N type MOS transistor T4 having their drains connected to the gate of MOS transistor T1 via an interconnection S1. MOS transistor T3 has its source connected to a second power supply voltage VDD2 that is higher than the first power supply voltage VDD1. MOS transistor T4 has its source connected to GND. A control signal from another circuit not shown is applied to the gates of MOS transistors T3, T4 and T2. The node of MOS transistors T1 and T2 is connected to an output terminal OUT. The N type semiconductor substrate of MOS transistor T3 is connected to the second power supply voltage VDD2. The P type wells of MOS transistors T2 and T4 are connected to GND. The P type well of MOS transistor T1 is connected to a potential identical to that of output terminal OUT.

Resistances R1–R4 of respective MOS transistors indicate the ON resistance when each MOS transistor is conducting (ON). Resistance R5 indicates the resistance of the gate of MOS transistor T1. The resistance of the gates of the MOS transistors other than MOS transistor T1 has a relatively small driving capability, and is not illustrated since the effect by the gate resistance is small.

FIG. 3 shows a layout arrangement of the structure of MOS transistor T1 included in the output circuit of FIG. 2. Referring to FIG. 3, MOS transistor T1' includes a diffusion region that becomes a source region 1a and a drain region 1b formed by having N type impurities introduced into the semiconductor substrate. A gate 2 formed of a plurality of parallel lines of polysilicon and the like is provided above the region between source region 1a and drain region 1b. The plurality of source regions 1a and drain regions 1b are respectively connected by metal interconnection layers 3a and 3b such as of aluminum to function as one source electrode and one drain electrode. The plurality of source and drain regions 1a and 1b are also connected to another circuit and another output terminal. Each diffusion region and each metal interconnection layer are electrically connected by a connection hole (contact) 4. The fabrication process thereof corresponds to the general process of forming a MOS. Therefore, details of the fabrication method will not be provided here.

FIG. 3 shows the arrangement in which the driving capability is increased with a conventional MOS transistor. More specifically, a plurality of MOS transistors having a unitary channel width W' several ten to several hundred times the channel length L are connected in parallel to form one MOS transistor T1'. Problems encountered in this conventional arrangement are set forth in the following.

Gate 2 formed of polysilicon having a resistance value (resistivity) per unit area generally as much as several tens $\Omega$ is connected by metal interconnection layer 3c outside the diffusion region. Gate 2 located remote from metal interconnection layer 3c having a resistivity lower than that of polysilicon will have signal transfer delayed due to the resistance of a distributed constant and the parasitic capacitance together with the effect of ON resistances R3 and R4 of MOS transistors T3 and T4. Therefore, the switching rate of conduction and cutoff of MOS transistor T1' is delayed. The switching rate could not be increased. A low switching rate causes a through current to be conducted across the power supply lines at the time of switching to result in a great loss. It was difficult to increase the transfer efficiency to improve the operable time of the device.

SUMMARY OF THE INVENTION

In view of the foregoing, a main object of the present invention is to provide a semiconductor integrated circuit device using a MOS transistor as an output transistor in a structure that can easily have the interconnection resistance of a distributed constant of the gate thereof reduced, whereby the switching rate and transfer efficiency are improved, and loss reduced in the semiconductor integrated circuit device to facilitate increase of the operable time of the device employing the semiconductor integrated circuit device.

According to an aspect of the present invention, a semiconductor integrated circuit device has a MOS type transistor formed on a semiconductor substrate as a transistor to output a great current. The source and drain of the transistor is formed by connecting a plurality of source regions and drain regions surrounded by a gate electrode respectively in parallel.

According to the present invention, the resistance value of a distributed constant of the gate located far away from the connection with the metal interconnection layer having a resistivity lower than that of a polysilicon layer can easily be reduced. Therefore, the switching rate and transfer efficiency can readily be improved. The loss of the semiconductor integrated circuit device can be reduced. The operable time of the device employing this semiconductor integrated circuit device can easily be increased.

Preferably, the gate electrode is formed in a lattice configuration. At least three drain regions or source regions are formed at the periphery of each source region or drain region.

More preferably, a diffusion region for connecting a well region formed in the semiconductor substrate to a predetermined potential is provided at each source region of the transistor.

According to the preferable embodiment of the present invention, the resistance value of a distributed constant of a well region formed at or in the semiconductor substrate can easily be reduced to stabilize the potential. This facilitates the layout of a transistor element occupying a great area such as an output MOS transistor. The time required for layout can be reduced. Furthermore, the breakdown voltage during the ON period of the MOS transistor can be maintained at a high level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
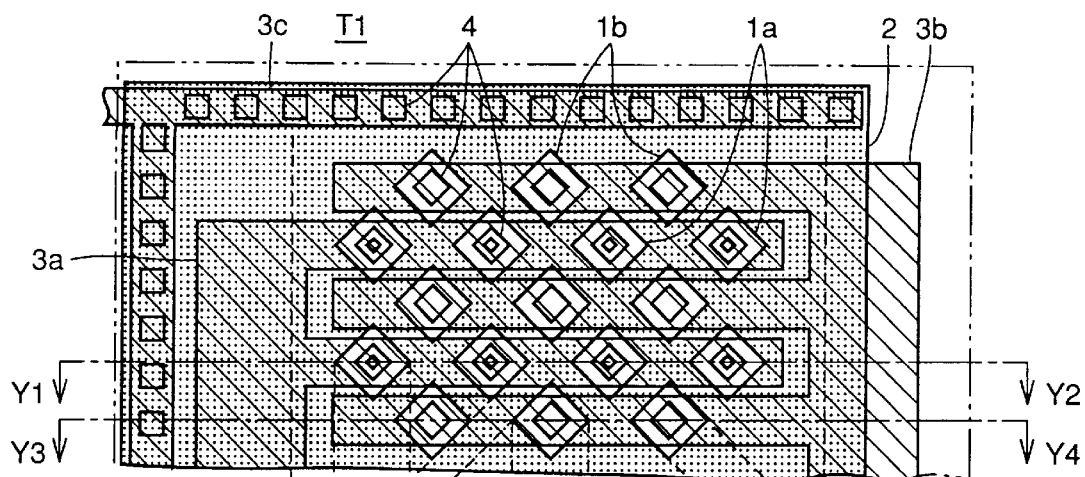
FIGS. 1A–1C show a structure of a MOS transistor of a semiconductor integrated circuit device according to an embodiment of the present invention.
Figure 1B:
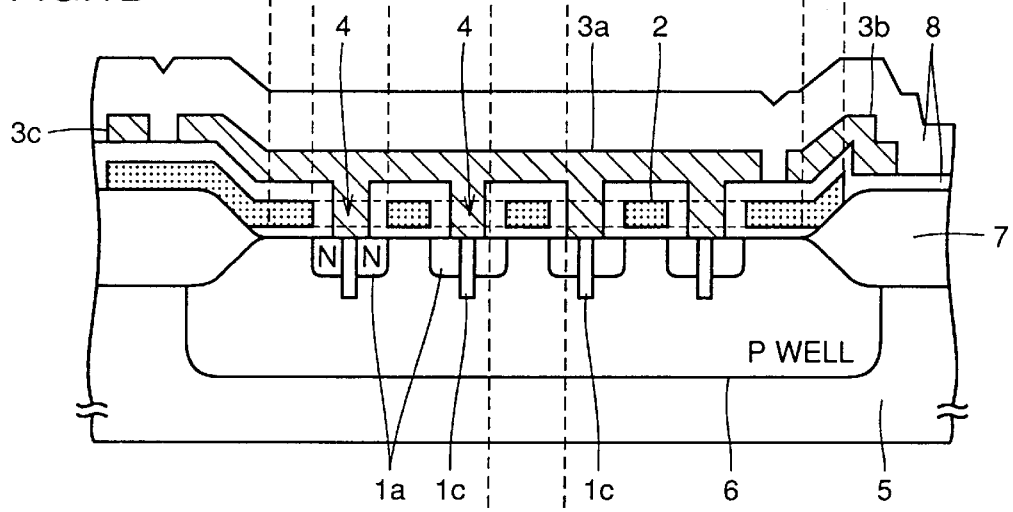
Figure 1C:
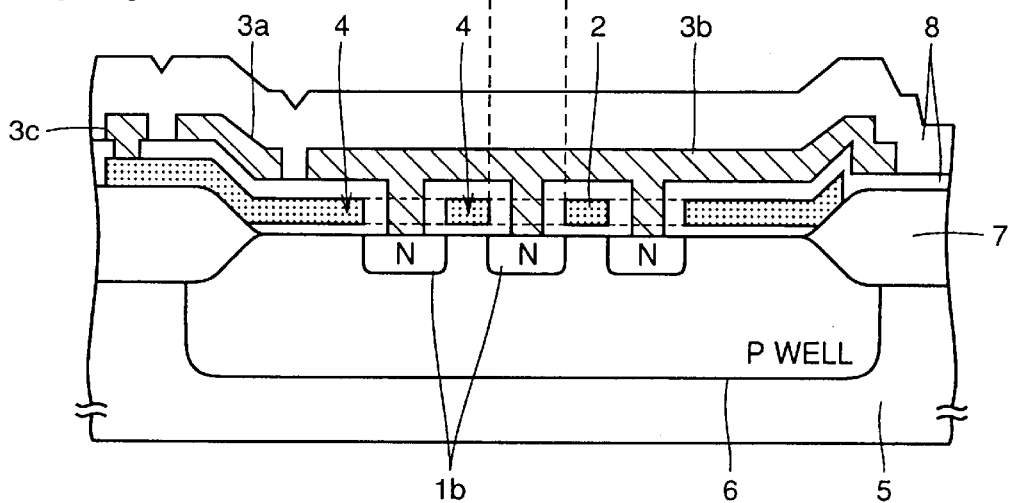

FIGS. 1A–1C show the structure of an N type MOS transistor T1 for output used in a semiconductor integrated circuit device according to the present invention. Particularly, FIG. 1A is a top plan view of the main components thereof. FIG. 1B is a sectional view taken along line Y1–Y2 of FIG. 1A. FIG. 1C is a sectional view taken along line Y3–Y4 of FIG. 1A. For the sake of simplification, likewise components in each figure is indicated with the same hatched line. The thickness of each layer in the sectional view are represented schematically.

Referring to FIG. 1A, output MOS transistor T1 includes a gate 2 formed of polysilicon and the like, arranged in a lattice manner. N type impurities are introduced by thermal diffusion or ion-implantation into the region enclosed by gate 2 to form a plurality, for example several hundreds or several thousands, of source region 1a and drain region 1b. A metal interconnection layer 3a of aluminum and the like is provided in parallel on source regions 1a to connect the plurality of source regions 1a in parallel to form one source electrode. A metal interconnection layer 3b is provided on drain regions 1b to connect the plurality of drain regions 1b in parallel to form one drain electrode. Gate 2 has its end connected by metal interconnection layer 3c to have the resistance value of a distributed contact reduced. Each diffusion region is electrically connected to each metal interconnection layer by a connection hole (contact) 4.

More specifically, a plurality of unitary MOS transistors having a channel length L and a unitary channel width of W are formed around each source region 1a and drain region 1b. The sum of each unitary channel width is the total channel width that defines the driving capability of MOS transistor T1. Since gate 2 is formed in a lattice manner, the resistance of a distributed constant can be reduced more easily than in a conventional case.

The structure of MOS transistor T1 is further described with reference to the sectional views of FIGS. 1B and 1C. Referring to FIG. 1B, a portion of N type semiconductor substrate 5 corresponding to a region (called active area) enclosed by a selective oxide film (called LOCOS) 7 has P type impurities introduced to form a well 6. A plurality of diffusion regions 1a are formed in well 6 by having N type impurities introduced. A gate 2 of a polysilicon layer is formed at a region above and in the periphery of diffusion region 1a. Metal interconnection layer 3a is formed above each diffusion region 1a and gate 2. A protection film 8 such as of an oxide film or a nitride film is formed above gate 2 and metal interconnection layer 3a.

P type impurities are introduced at the center portion of each diffusion region 1a so as to pierce diffusion region 1a. As a result, a diffusion region (called batting contact) 1c for connecting well 6 to a predetermined potential is formed. Each of diffusion regions 1a and 1c is connected to an output terminal OUT not shown via metal interconnection layer 3a. According to the above-described structure, the resistance of a distributed constant of well 6 can easily be reduced to maintain the potential stably.

Referring to FIG. 1C, the drain of MOS transistor T1 is formed of a plurality of drain regions 1b. Drain region 1b is formed in a manner similar to that of diffusion region 1a provided that there is no diffusion region 1c. Each drain region 1b is connected to a power supply voltage line VDD1 via metal interconnection layer 3b.

In the above description, the layout of one interconnection using an N type semiconductor substrate is shown. The same can be applied to a semiconductor integrated circuit device using a P type semiconductor substrate. Furthermore, the present invention is applicable to a semiconductor integrated circuit device using a multilayer interconnection having two or more metal interconnection layers.

Although a layout is shown in which diffusion layer 1c is provided in all the source regions to connect well 6 to a predetermined potential, diffusion layer 1c can be provided for every plurality of source regions, or only at a peripheral region of the gate. Also, diffusion region 1c can be provided in diffusion region 1a other than the center portion thereof. In the above description, each source region 1a, drain region 1b and connection hole 4 has a square configuration. A similar effect can be expected with a polygon configuration other than a square such as a hexagon, provided that some useless region will be formed.

Figure 2:
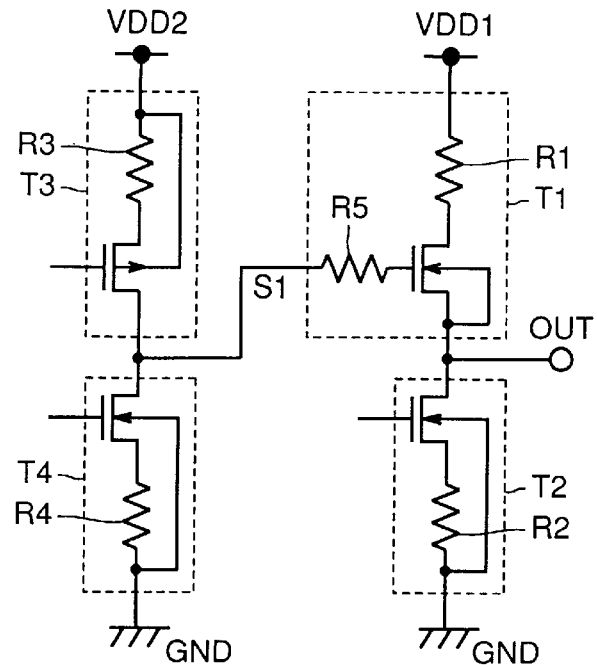
FIG. 2 is a circuit diagram showing an example of an output circuit employing a conventional MOS transistor.
Figure 3:
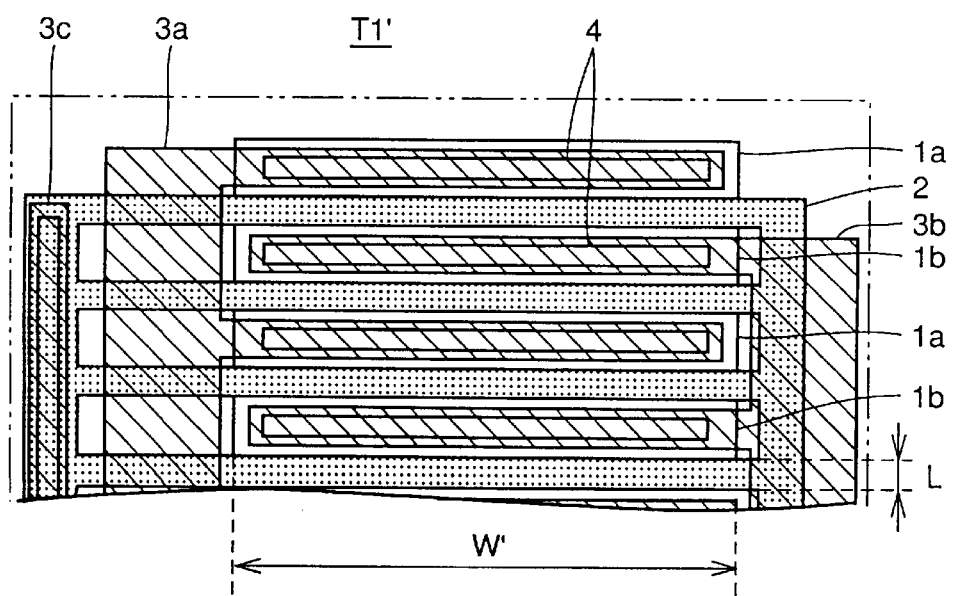
FIG. 3 shows a layout of a conventional MOS transistor.

Although the above description is provided for an output circuit as shown in FIG. 2, the MOS transistor of the present invention can be used for MOS transistor T2. Furthermore, the present invention is applicable to an output circuit using a bipolar type transistor instead of MOS transistors T2–T4, or to an output circuit of another structure.

According to the present embodiment, the resistance value of a distributed constant of the gate located remote from the connection with a metal interconnection layer of a resistivity lower than that of a polysilicon layer can easily be reduced. Therefore, the switching rate and transfer efficiency can easily be improved. The loss of the semiconductor integrated circuit device can be reduced to easily increase the operable time of the device using this semiconductor device. Furthermore, the resistance value of a distributed constant of the well region formed at or in the semiconductor substrate can be reduced to stabilize the potential. The layout is facilitated to reduce the time required for layout even for a transistor element occupying a large area such as an output MOS transistor. Furthermore, the breakdown voltage of the MOS transistor during the ON period can be maintained at a high level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having a MOS type transistor formed on a semiconductor substrate as a transistor for an output of a large current, wherein said transistor has a source and drain formed by connecting a plurality of source regions and drain regions, surrounded by a gate electrode, in parallel respectively, and a channel is formed only beneath the gate electrode between adjacent source and drain regions, said source and drain regions having a square configuration, wherein said gate electrode is formed in a lattice configuration, wherein at least three drain regions or source regions are formed at the periphery of each said source region or drain region, wherein a diffusion region is formed to pierce therethrough a center portion of each source region of said transistor, said diffusion region for connecting a well region formed in said semiconductor substrate to a predetermined potential.

* * * * *

UNITED STATES PATENT AND TRADEMARK OFFICE
CERTIFICATE OF CORRECTION

PATENT NO. : 6,121,657

DATED : September 19, 2000

INVENTOR(S) : Michiaki YAMA

It is certified that error appears in the above-identified patent and that said Letters Patent is hereby corrected as shown below:

Item [22] Change ``Jul. 14, 1997'' to --Jul. 16, 1997--.

Signed and Sealed this

Twenty-second Day of May, 2001

*Attest:*

NICHOLAS P. GODICI

*Attesting Officer*   Acting Director of the United States Patent and Trademark Office